United States Patent [19]
Bartelink

[11] Patent Number: 5,189,505
[45] Date of Patent: * Feb. 23, 1993

[54] FLEXIBLE ATTACHMENT FLIP-CHIP ASSEMBLY

[75] Inventor: Dirk J. Bartelink, Los Altos Hills, Calif.

[73] Assignee: Hewlett-Packard Company, Palo Alto, Calif.

[*] Notice: The portion of the term of this patent subsequent to Dec. 31, 2008 has been disclaimed.

[21] Appl. No.: 748,991

[22] Filed: Aug. 22, 1991

Related U.S. Application Data

[63] Continuation-in-part of Ser. No. 433,485, Nov. 8, 1989, Pat. No. 5,077,598.

[51] Int. Cl.$^5$ .................. H01C 23/48; H01C 29/44; H01C 29/52; H01C 29/60
[52] U.S. Cl. ............................... 257/419; 257/774; 257/776; 257/747
[58] Field of Search ..................... 357/26, 68, 69, 79, 357/76

[56] References Cited

U.S. PATENT DOCUMENTS

| | | | |
|---|---|---|---|
| 3,030,558 | 4/1962 | Berg et al. | 357/68 |
| 3,596,228 | 7/1971 | Reed et al. | 359/59 |
| 4,070,688 | 1/1978 | Wislocky | 357/68 |
| 4,215,359 | 7/1980 | Schermer | 357/70 |
| 4,647,959 | 3/1987 | Smith et al. | 357/74 |
| 4,674,319 | 6/1987 | Muller | 73/23 |
| 4,710,798 | 12/1987 | Mercantonio | 357/80 |
| 4,845,542 | 7/1989 | Bezuk et al. | 357/68 |
| 4,871,921 | 10/1989 | Gurnee | 250/578 |
| 4,893,172 | 1/1990 | Matsumoto et al. | 357/79 |
| 5,077,598 | 12/1991 | Bartelink | 357/68 |

FOREIGN PATENT DOCUMENTS 3129568 4/1982 Japan .

OTHER PUBLICATIONS

Ecker, "Multilevel alloy joining system . . ." *IBM Tech.*, 1978, vol. 21 #7, pp. 2743-2746.
"Areal Contacting of Chips to Modules", IBM Technical Disclosure Bulletin, vol. 30, No. 4, Sep. 1987, p. 1604.
Ernest Levine and J. Ordonez, "Analysis of Thermal Cycle Fatigue Damage in Microsocket Solder Joints", IEEE Transactions on Components, Hybrids and Manufacturing Technology, vol. CHMT-4, No. 4, Dec., 1981, pp. 515-519.
Fumio Nakano, Tasao Soga and Shigeo Amagi, Hitachi Research Laboratory, "Resin-Insertion Effect on Thermal Cycle Resistivity of Flip-Chip Mounted LSI Devices", USHM '87 Proceedings, p. 536.
Ho-Ming Tong et al. "Ceramic Packages for Liquid-Nitrogen Operation", IEEE Transactions on Electron Devices, vol. ED-36, No. 8, Aug., 1989, pp. 1521-1527.
J. B. Lasky et al., "Silicon-On-Insulator (SOI) by Bonding and Etch-Back", International Electron Devices Meeting, 1985, pp. 684-687.
Kurt E. Peterson, "Dynamic Micromechanics on Silicon: Techniques and Devices", vol. ED-25, No. 10, Oct., 1987, pp. 1241-1250.

*Primary Examiner*—Andrew J. James
*Assistant Examiner*—Stephen D. Meier
*Attorney, Agent, or Firm*—Howard R. Boyle

[57] ABSTRACT

A multiple chip module (MCM) is fabricated by connecting a series of semiconductor chips, in a flip-chip orientation, to a multi-chip substrate with resilient connection pads. The substrate is formed from silicon by placing a layer of SiO2 on the surface. At the locations requiring a resilient connection pad, the SiO2 layer is pierced with a series of closely spaced holes. A cavity is etched out of the silicon below the closely spaced holes. The SiO2 layer is now suspended over the cavity and forms a flexible membrane. A post is formed on top of the flexible membrane. A conductor formed on the substrate has one end supported by the post. One end of the conductor is, therefor, supported by the post and flexible membrane so that a solder bump placed thereon may be used for a demountable connection to a contact pad on a flip-chip.

18 Claims, 14 Drawing Sheets

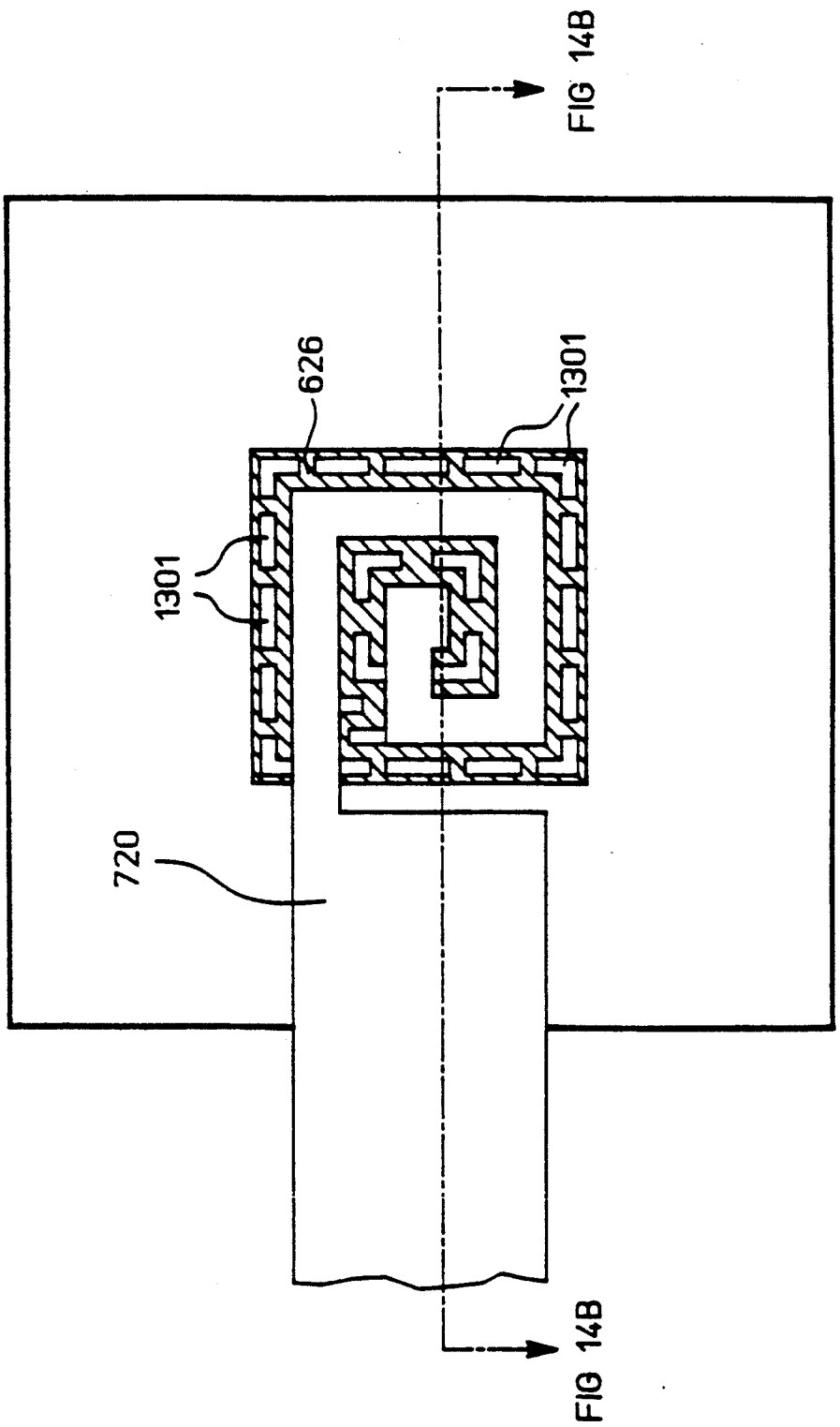

5,189,505

FLEXIBLE ATTACHMENT FLIP-CHIP ASSEMBLY

CROSS-REFERENCE

This application is a continuation-in-part of copending U.S. application Ser. No. 07/433,485, filed on Nov. 8, 1989, now U.S. Pat. No. 5,077,598 by the same inventor. U.S. application Ser. No. 07/433,485 is incorporated by reference into this application.

BACKGROUND OF THE INVENTION

1. Field of the Invention

This invention relates to integrated circuit (IC) design and manufacturing technology and particularly to a technology for interconnecting multiple IC chips into a multi-chip module (MCM).

2. Description of the Prior Art

The conventional approach to the fabrication of large, dense ICs uses a single large monolithic chip on which all required circuits are integrated. After fabrication, the chip is then packaged in any of several multi-lead electronic packages. Such monolithic chips typically can only be made by a single manufacturing technology, such as CMOS, Bipolar, BiCMOS or GaAs technologies.

The complexity of such chips has resulted in costly design cycles and low manufacturing yields. As the level of integration increases, driven by the need for high on-chip clock speeds, the die size increases which further limits manufacturing yields and increases die testing costs. The very large scale monolithic integration, now required, also substantially increases the design cycle costs for the entire system being designed because of the increased costs and difficulties associated with prototyping, debugging, and performing design iterations based around a single complex chip.

Also, the use of a single family of processes to manufacture each densely integrated monolithic chip has inherent design limitations. A substantial systems improvement would result if the designer were able to mix manufacturing technologies at will. The ability to use the manufacturing family of processes which is optimal for each type of circuit function will become critical as optical techniques become more intermixed with other signal processing techniques in the same devices.

The development of multi-chip modules, or MCMs, has overcome certain of the limitations inherent in large scale monolithic IC designs. An MCM is made by incorporating two or more assembled sub-chips on a multi-chip substrate and into a single IC package.

In a typical MCM, a complex circuit is distributed among two or more separate chips, or sub-chips with each sub-chip containing only a portion of the overall circuitry of the MCM. Each chip is therefore substantially less complex and less expensive to design and build than the equivalent monolithic chip.

An important advantage of such an MCM is that several sub-chips, each made by a different processing technology, may be incorporated into a single package. Another advantage is that the sub-chips are smaller than monolithic ICs and therefore are easier to design, test and manufacture.

MCM technology also offers a significant testing advantage over standard single chip VLSI technology. Generally, a chip is tested by contacting conductive "pads" on the chip with a test probe which is connected to a test instrument. The pads must be large enough to accommodate wire bonding, tape automated bonding, or solder bumps and to provide reliable connections between the chip circuitry and the many contacts of the probe during test. With simple integrated circuits, these pads can be distributed about the periphery of the chip. With more complex circuits, the required number of pads requires that they be distributed over the active surface of the chip. The size, distribution and number of pads limit circuit density. In addition, the pads add capacitance to the signal paths, limiting the switching speed of the integrated circuit.

The challenge for multi-chip packages has been to develop a serviceable interface between the multi-chip substrate and the individual sub-chips. Flip-chip interfacing provides one of the more promising approaches in which the active surfaces of the various sub-chips are "flipped" to mate with the active surface of the multi-chip substrate. This orientation results in shorter signal path lengths than other MCM designs because it permits the design to include the minimum distance between electrical contacts on the multi-chip substrate and the facing contacts on each sub-chip. In some cases, the electrical contact length between circuits can be shorter in a flip-chip MCM design than in a single VLSI design.

Demountable flip-chip packages also provide substantial prototyping and testing benefits because the multi-chip package can be tested with known good sub-chips, and vice-versa. Since individual chips can be removed from the MCM, they can be tested in the real operating environment and replaced if defective. This in-situ testing eliminates the need for in-wafer testing which is required of VLSI single chip designs because of the low yields and high package cost of VLSI chips. By eliminating in-wafer testing, the need for large pads required by test probes and for electrical static discharge (ESD) protection for the input or output transistors connected to the pads is also eliminated. Also, since the output transistors no longer need to drive the test circuitry, the transistors can be smaller and switch faster.

The key to the successful implementation of demountable flip-chip MCMs is the convenient, repeatable, precision alignment of chips with the substrate. If the components cannot be aligned precisely, then large contact pads will be required. As already indicated, large contact pads limit the circuit density of the chips and introduce capacitances which limit device speed. Also, if chip placement cannot be performed conveniently, repeatably and precisely, substitution testing and component replacement will be much more difficult.

A substantial improvement in this critical area is taught in U.S. Pat. 4,949,148, entitled "Self-Aligning Integrated Circuit Assembly" awarded to the inventor hereof on Aug. 14, 1990 and assigned to the same assignee as the present invention. In that technique, the inherent optical flatness of the semiconductor surfaces was exploited to form a high-precision, self-aligning MCM assembly. Rigid contacts or "gold bumps" on one of the sub-chips are mated with the appropriate contacts supported by flexible membranes on the MCM substrate. The resulting sliding contacts are maintained by the spring pressure of the suspended, flexible substrate.

The gold bump attachment method features high connection density, chip demountability, substitution testing and continued reliability during differential thermal expansion. In addition, the gold bumps can be made fairly small since the carrier uses a single metalization layer system. However, if a multi-layer metalization system is employed, the overall size of the gold bumps must be increased to enable them to clear the upper interconnection layers when reaching down to the membranes and maintaining sturdiness at the same time. The resulting lower connection density and uneven chip surfaces, as well as the fact that gold is an inconvenient metalization for mass produced integrated circuits, makes this attachment method unattractive for VLSI ICs. Accordingly there is a need for some other way of making reliable electrical and mechanical connections between the sub-chips and the substrate in a multi-layer MCM package.

One permanent method of attaching sub-chips to a substrate, in an MCM, is to use solder balls. This method of attachment is characterized by an inherent minimum interconnect pitch which arises from the limited plastic deformation that can be absorbed by the solder ball. Since soldering suggests that the shape of the ball in the molten state is controlled by surface tension, the ball must be approximately spherical in shape. This shape implies the ball has roughly equal vertical and lateral dimensions. Practical experience with solder ball shear strength indicates that the lateral displacement of the connections at the top and bottom of the solder ball can be no more than about 1% of the height before the onset of fracture failures, i.e., the limit imposed by plastic deformation. The smallest interconnect pitch (solder ball diameter) must therefore be no less than a hundred or so times the worst-case lateral shift of pairs of connection points on the chip and the carrier under thermal cycling. This lateral shift depends only on the size of the die and the temperature difference between the chip and the substrate, assuming silicon to be the material for both the chip and the substrate. For a 10 mm by 10 mm chip and a temperature difference of 50° C., the center to corner shift is about 0.9 um (micrometer), leading to a pitch of the order of 100 um. In order to achieve an interconnect pitch in a range comparable with on-chip wiring, conventional solder-ball attachment methods will not work.

A prior art method of interconnecting chips to a module is disclosed in the IBM Technical Disclosure Bulletin, Vol. 30, No. 4, Pages 1604–1605, Sep., 1987. In the IBM disclosure, the connection between the chip and the substrate is made by a post supported by a thin spiral or comb-shaped conducting silicon spring which provides for limited movement in the vertical(Z) direction (perpendicular to the surface of the chip). The contact post is always held at 90 degrees relative to both the surface of the chip and the surface of the substrate by its rigid attachment to the chip.

FIGS. 15, 16 and 17 illustrate the IBM interconnecting apparatus. FIGS. 15 and 16 show a plan view and a sectional view of a wiring substrate 1500; including electrically conductive interconnection lines 1502 and spring contact areas 1504. Each spring contact area P104 has an associated spiral spring contact 1506 constructed of a thin boron doped silicon layer overlaying the non-conductive silicon substrate 1500. As shown, a contact pad 1508 is the terminal contact point for the spring 1506. To allow for mechanical clearance, each spring structure 1506 has associated with it a pit 1510 formed underneath the spring. These silicon structures are formed with the boron-doped silicon layer acting as a non-etchable layer under which pits 1510 for spring deflection, and pits 1512 for the conductors, are etched out of the substrate 1500.

FIG. 17 shows a chip 1602 soldered to the spring contacts on the silicon wiring substrate 1500. In this example, a CrCuSn metallurgy structure interacts with a Sn solder pad 1604 on a chip conductor line 1606. A conductor 1608 is fabricated up the side of the pit 1512 and interconnects the lines 1502 to the spring structure 1506.

While this spring structure may allow for slight variations in height between the surface of the chip 1602 and the substrate 1500, the structure does not meet the requirements of an interconnection system in a complex MCM. Because of the possible misalignment between the chips and the module in a MCM, the interconnection post between the chips and module cannot always be vertical (ie. 90 degrees). In addition to misalignment, the interconnections must also allow for the differences in thermal expansion between the chips and the module. The thermal expansion can produce a change in the connection alignment in all three axes, X, Y and Z. If the connections between the chips and module cannot flex in the X and Y directions, the connection will be under stress and unreliable. The IBM interconnection method also requires special processing that is inconvenient and costly in semiconductor manufacturing. For example, because of resist coating and focusing requirements, the routing of the conductor 1608 is difficult to achieve.

It follows then that there is a need for a way to attach a VLSI sub-chip having a multi-layer metal structure to a multi-chip substrate in a flip-chip assembly. The attachment method must furnish a reliable interface which is maintained during differential thermal expansion in the X, Y and Z directions. In addition, the attachment structure must be fabricated employing conventional IC processing techniques used for chips and carriers.

SUMMARY OF THE INVENTION

The preceding and other shortcomings of the prior art are addressed and overcome by the present invention that provides a chip to substrate resilient contact which flexes with three degrees of freedom. By flexing, the contact is able to compensate for the effects of differential thermal expansion, or for a slight misalignment between a sub-chip and a substrate, in a MCM.

Each resilient contact is formed by available integrated circuit processing technology to include a tiltable post supported by a resilient membrane across a central portion of a chamber etched in one, or both, of the chip and the MCM substrate. The post is rigid or flexible as desired. If the post is flexible, the conductor is preferably formed in a compliant shape such as a helix and supported by the post. If the post is rigid, the conductor is advantageously located in a passage that extends axially through the post.

The resilient membrane is formed with a roughly square or circular cross-section. Holes are etched in the membrane to form a series of concentric rings. Each concentric ring is attached to the next ring by staggered legs designed so each ring is supported by approximately the same amount of material. This ring design permits the membrane to distort in a bending fashion when the center of the membrane is flexed.

In one MCM embodiment, the connection post comprises two opposing connection posts. Each post is made of dielectric material with an inner conductive core formed by a vertically interconnected structure of metal layers provided by the fabrication process. One end of one of the posts is flexibly joined to a sub-chip by means of a flexible membrane, and one end of the other post is similarly joined to the carrier. The other ends of the posts are joined together by a solder bump which makes a rigid mechanical joint between the posts and a good electrical connection between their conductive cores. When the flip-chip assembly is subjected to differential thermal expansion, the connection post assembly flexes with three degrees of freedom. Therefore the shear strain, normally occurring in solder bumps of conventional rigid assemblies, is practically eliminated.

In another embodiment, a compliant conductor is affixed to a substrate in a cantilever fashion at one end and supported by a post on the other end. The post is supported by a flexible membrane suspended over a cavity formed in the substrate. Electrical contact between a sub-chip and the conductor is made by using a solder ball or other conductive bump.

The present invention features a new attachment method of a flip-chip assembly which additionally constitutes an environment for convenient testing. Specifically, a "membrane prober" is made by using cantilevered conductors as described above. Conductive bumps are used to make electrical connections between a sub-chip being tested and the conductors on the substrate. The membrane prober is then interfaced with a tester for conventional vector testing of both individual chips and multi-chip systems.

The membrane prober also serves as a "system-emulator" for testing individual production chips. As a system-emulator, the membrane prober has the significant advantage of providing a test environment that accurately represents the full system, and saves some of the ever increasing costs of test development and hardware associated with the testing of complex systems.

These and other features and advantages of this invention will become further apparent from the detailed description and drawings that follow. In the figures and description, numerals indicate the various features of the invention, like numerals referring to like features throughout both the drawings and the description.

BRIEF DESCRIPTION OF THE DRAWINGS

FIG. 14(A) is a plan view of the preferred membrane and contact structure.

In the figures, a component, element, or step is referenced by a three or four digit number. The first digit in a three digit number or the first two digits in a four digit number indicate the first figure in which the referent was introduced. For example, carrier wafer 102 is first shown in FIG. 1 and the holes 1320 are first shown in FIG. 13. This is intended to aid the reader in locating a referent.

DESCRIPTION OF THE PREFERRED EMBODIMENTS

Figure 1:
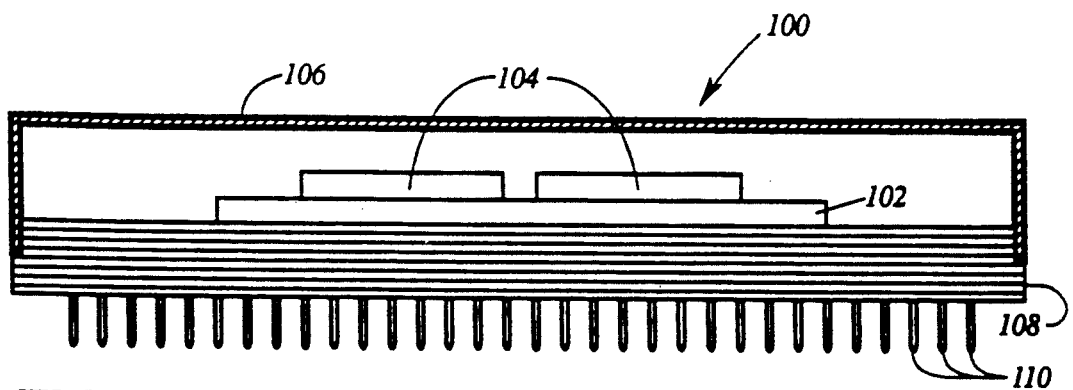
FIG. 1 is a sectional view of an integrated circuit package which contains a multi-chip integrated circuit assembly in accordance with the present invention.

In accordance with the present invention, a multiple integrated circuit package 100 contains a carrier wafer 102, two integrated circuit (IC) chips 104, a ceramic housing 108 and a package lid 106, as shown in FIG. 1. The IC chips 104 contain the circuits performing the system function assigned to the package 100, whereas the carrier 102 contains some or none of the interface circuits and all the system interconnections including conductive paths between the various connection pads on the chips 104 and a plurality of connection pins 110. The connection pins 110 provide the interface between the package 100 and an incorporating system.

Figure 2:
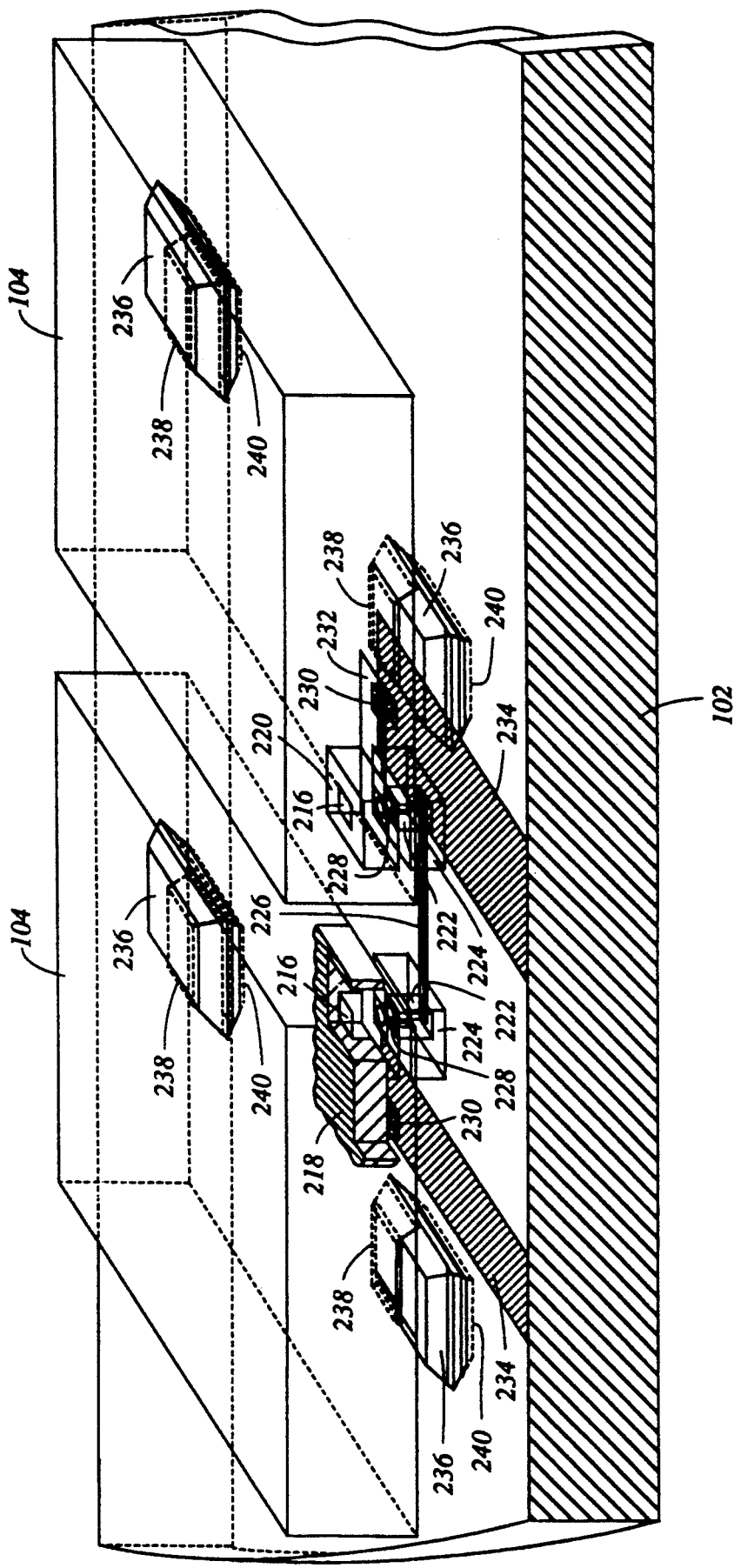
FIG. 2 is a detailed view of the multi-chip assembly shown in FIG. 1.

In the MCM, the accurate final alignment of IC chips 104 in the X and Y plane of the carrier wafer 102 is provided by pin blocks 236 which mate with apertures 240 in the carrier wafer 102 and with slots 238 in chips 104, as shown in FIG. 2. The initial chip to carrier misalignment during assembly is automatically corrected by the engagement of pin blocks with apertures and slots through the application of pressure by an assembly tool under robotic control. This correction process is defined as "self-alignment", which allows for precise registration between the chips and the carrier.

Figure 3B:
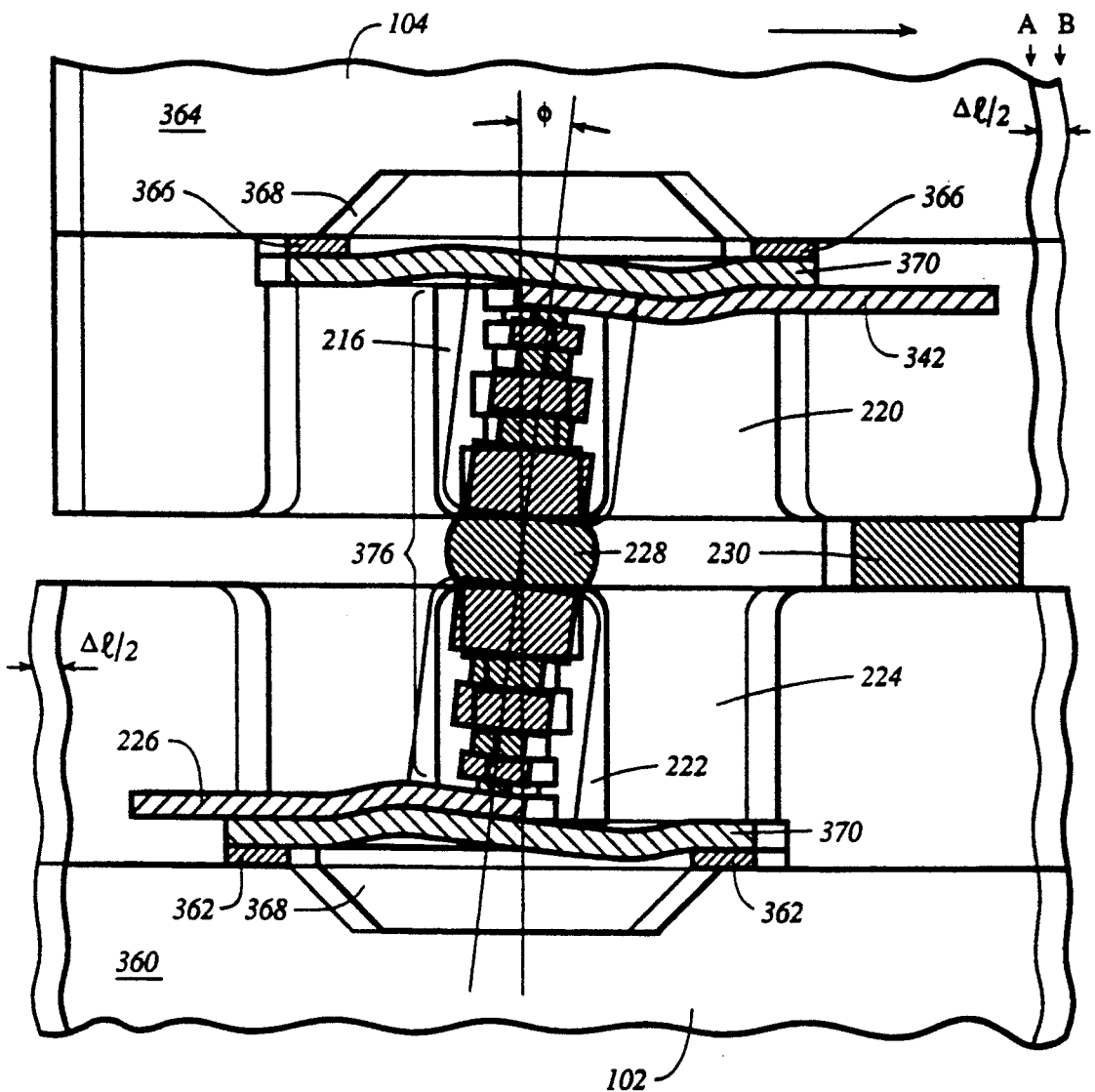
FIG. 3B is a sectional view of one of the connection posts in FIG. 3A shown tilted as a result of differential thermal expansion.
Figure 3A:
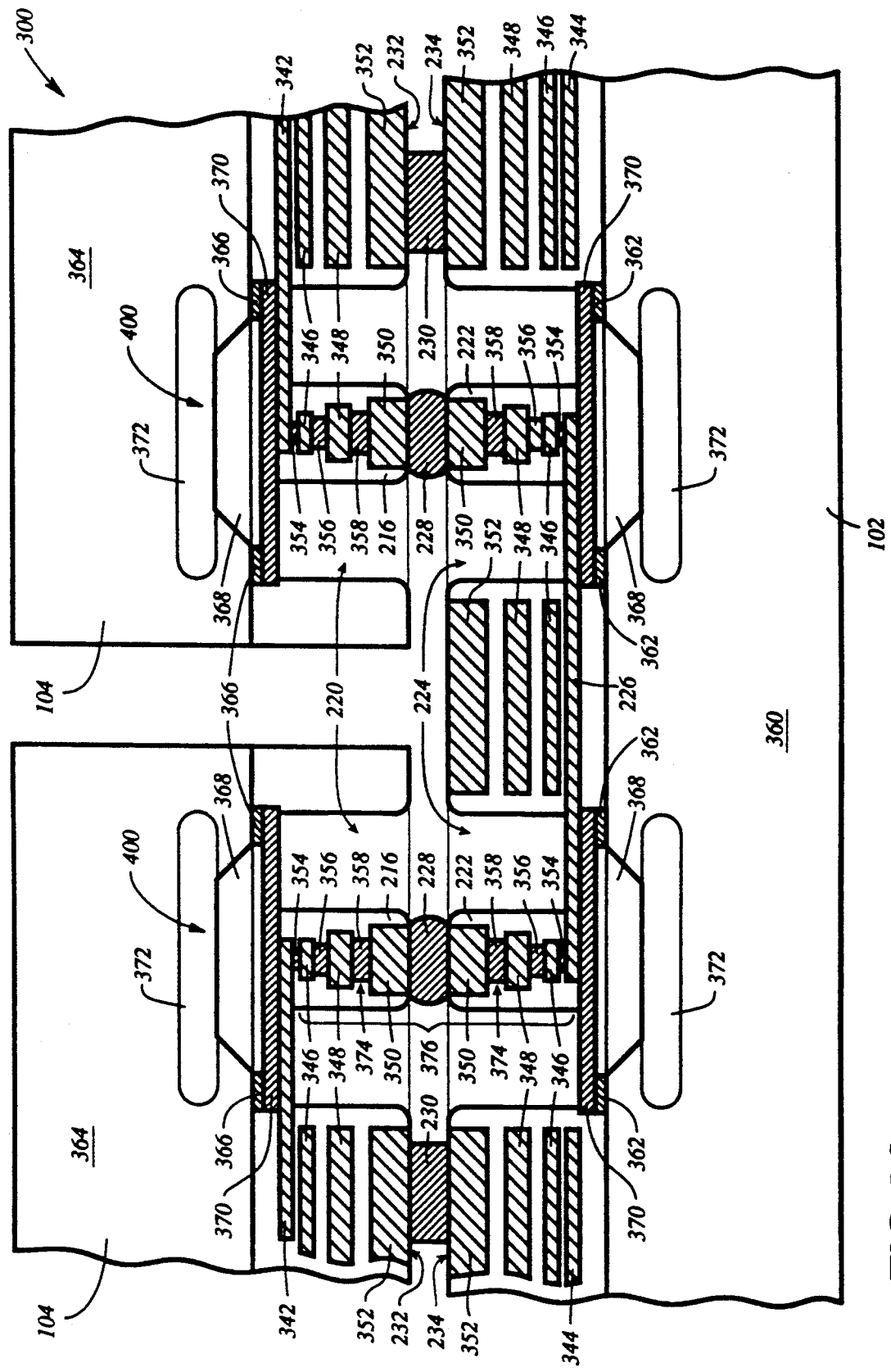
FIG. 3A is a sectional view of connection posts and limit feet shown in FIG. 2.

Carrier wafer 102, pin blocks 236 and IC chips 104 collectively constitute a self aligned IC flip-chip assembly 300, as shown in FIGS. 2 and 3A.

Figure 4:
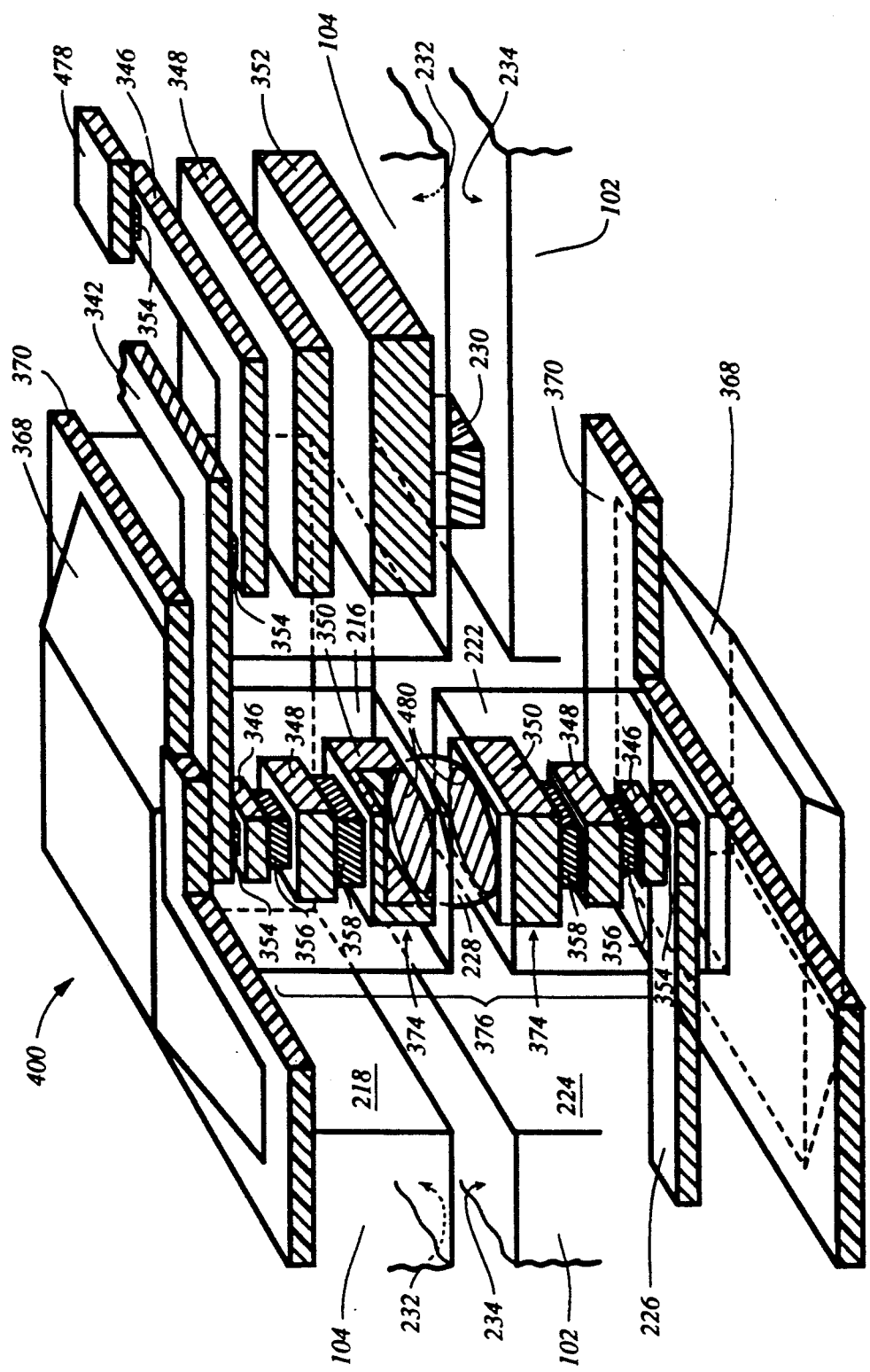
FIG. 4 is a detailed three-dimensional view of one of the connection posts of FIG. 3A.

Carrier wafer 102 and IC chips 104 are attached using connection assemblies 400, as shown in FIGS. 3A and 4. The latter consist of connection posts 376, containing posts 216 and 222 joined by solder bump 228, and flexible members which are comprised of cavities 368 covered by flexible silicon dioxide membranes 370. Connection posts 216 are attached to flexible membranes 370 on chips 104 and connection posts 222 attach to membranes 370 on carrier wafer 102. Each post, 216, 222 contains a conductive core 374 which is made of a multi-level interconnect structure of predefined metal islands from all metal layers used in the process. The structure of core 374 comprises metal islands 360, 348, 346 and interconnects 342, 226, as well as vias 358, 356 and 354 respectively.

Flexible membranes 370, made of silicon dioxide, are formed over cavities 368 and filled with a compressible (soft) material. Cavities 368, shown in FIG. 3A, are filled with air.

Apertures 240, slots 238 and cavities 368 of wafer 102 can be formed by employing similar processes. The fabrication of apertures 240 and cavities 368 starts with growing an oxide layer 362 on substrate 360 of carrier wafer 102. Oxide is then removed from rectangular areas of carrier wafer 102 where apertures 240 and cavities 368 are to be formed, using conventional photo-lithographic techniques. Finally, a highly anisotropic etch that stops on the <111> crystallographic planes defines apertures 240 and cavities 368 within the rectangular areas. This is accomplished by dipping carrier wafer 102 into an etchant solution, containing ethylenediamine, pyrocatechol and water, named "EDP". Alternative etchants with similar properties can also be used. The <111> oriented walls of apertures 240 and cavities 368 form an angle of approximately 54.74° with the top surface of wafer 102, which is defined along the <100> crystallographic plane. If desired for a flat bottomed cavity, etching terminates on an optional P+ buried layer 372, thereby creating flat bottoms of apertures 240 and cavities 368.

Slots 238 in chips 104 are formed using a similar process to the one described above. The array of chips in an integrated circuit wafer, including chips 104, are laterally separated by widened "scribe lines" to enable the formation of slots 238. Apertures are etched into the wafer across these scribe lines. After the processing of the wafer is complete, it is diced so as to bisect the apertures which renders slots 238 in chips 104 and its replicas.

The pin blocks 236 are formed by applying the same etching techniques used to fabricate apertures 240, cavities 368 and slots 238. A silicon wafer with a top and a bottom surface along <100> crystallographic orientations is coated on both sides with silicon dioxide. The congruent arrays of oxide islands are photo-lithographically defined on both wafer surfaces. After removing the oxide from inter-island regions, the patterned wafer is subjected to a double sided EDP etch which creates an array of pin blocks 236. The final pin blocks 236 have residual oxide layers etched off both the top and bottom surfaces. The lower and upper sidewalls of the pin blocks along the <111> crystallographic planes conform to corresponding walls of apertures 240 and slots 238.

A four-layer metal process is used to fabricate the carrier wafer 102 and the chips 104. Each of the connection posts 216 and 222 are formed by etching rings 220 and 224 into the dielectric around the photo-lithographically predefined metal islands in chips 104 and carrier wafer 102 respectively. Etching of vacant rings 220 and 224 is stopped at the top surface of membranes 370 and first layer metal interconnects 342 and 226 respectively, so that the post-to-membrane attachment areas are clearly defined. The inner walls of vacant rings 220 and 224 become the outer walls of the connection posts 216 and 222, whereas their outer walls define the holes in the active interconnection regions of chips 104 and carrier wafer 102 respectively. Dielectric wall 218, which is part of the active interconnection region of the left chip 104, accentuates the residual hole remaining from the formation of connection post 216, as shown in FIGS. 2 and 4.

The connection assemblies 400, which link the chips and the carrier of the flip-chip assembly 300, have electrical as well as unique mechanical attributes which are discussed below.

Each of the connection posts 216 and 222 are made of a dielectric shell and a conductive core 374 to electrically link the assembly components. Each core contains a structure of metal islands and vias, as shown in FIGS. 3A and 4. The metal islands are linked in the following succession. The first layer metal interconnects 342 in chips 104 and 226 in carrier wafer 102 are connected to the second layer metal interconnects 346 through vias 354. Second layer metal interconnects 346 are connected to third layer metal interconnects 348 through vias 356. Third layer metal interconnects 348 are connected to fourth layer metal interconnects 350 through vias 358.

A typical electrical path on chip 104, which links its active area with post 216, consists of a first layer metal trace 478 and first layer metal interconnect 342 which are interconnected through second layer metal 346 and vias 354, as shown in FIG. 4.

The electrical path between adjacent chips 104 in assembly 300 consists of two first layer metal interconnects 342 and two connection posts 376 joined by first layer metal interconnect 226. Each connection post 376 comprises a pair of opposing posts, 216 and 222, joined by solder bump 228. This invention takes advantage of conventional solder bump technology, which uses a 95/5 lead to tin solder composition. Solder is initially placed on posts 222 of carrier wafer 102 by way of a deposition or other process and subsequently attached to posts 216 of chips 104 during a one-shot reflow phase. More specifically, attachment of solder bump 228 to opposing posts 216 and 222 is due to molecular bonding between solder and metal which results in adhesion surfaces 480, as shown in FIG. 4.

Prior to the soldering phase of the flip-chip assembly 300, the spacing variations between the upper surfaces 232 of chips 104 and the upper surface 234 of the carrier wafer 102 are noticed. Since the contact areas of the connection posts 216 and 222 are co-planar with surfaces 232 and 234 respectively, local spacings, defined by contact areas 232 and 234 of opposing posts, can vary within prospective attachment areas. These spacing variations, which need to be accommodated during assembly of chips 104 and carrier wafer 102, can be kept within tight tolerances due to the fact that integrated circuit substrates are substantially optically flat. When chips 104 and carrier wafer 102 are aligned and brought together for soldering, these tolerances produce differently shaped solder bumps 228 of varying heights across attachment areas, so that spacing variations are accommodated.

The final shapes of the solder bumps 228 are created, in one embodiment, as a result of employing limit feet 230, which set the minimum spacing between the chips 104 and the carrier wafer 102 when the assembly is complete. The holding force of the flip-chip assembly, furnished by an assembly tool, maintains pressure on the limit feet 230 against the carrier surface 234 during assembly. Once solder bumps 228 have solidified, quiescent conditions for connection assemblies 400 are established where membranes 370 are flat and incur minimal initial tension.

Optional limit feet 230, which are attached to chip surfaces 232 and distributed across the interconnection areas, are made of dielectric and attached to a passivation layer over fourth layer metal 352. Alternatively, limit feet 230 can be made of metal and attached to the passivation layer over the interlevel dielectric surface 232.

The dimensions for connection assembly 400, shown in FIG. 4, are as follows. The overall height of connection posts 216 and 222 is 7.8 um (micrometer), with the following breakdown:

| | | |
|---|---|---|
| First layer metal interconnect | 342/226 | 0.7 um |
| First-to-Second metal via | 354 | 0.4 um |
| Second layer metal interconnect | 346 | 0.7 um |
| Second-to-Third metal via | 356 | 0.8 um |
| Third layer metal interconnect | 348 | 1.2 um |
| Third-to-Fourth metal via | 358 | 1.0 um |
| Fourth layer metal interconnect | 350 | 2.0 um |
| Passivation | | 1.0 um |

Solder bumps 228 are 3.0 um high. Flexible membranes 370 are 0.8 um thick and cavities 368 are 2.4 um deep.

The cross section of posts 222 and 216 is approximately 10.0 um × 10.0 um. Dimensions of corresponding vacant rings 224 and 220 respectively, shown in FIG. 3A, are 18.0 um × 18.0 um. These dimensions allow for a limited misalignment of opposite posts 222 and 216 in assembly 400 with a sufficiently small solder bump 228, assuming a cumulative alignment tolerance of +/−1.0 um (+/−2.0 um max) between chip 104 and carrier wafer 102.

Membranes 370 are fabricated using a unique bonding technique between oxide layers of carrier wafer 102 and a dummy wafer which is subsequently disposed of. The starting point of this process is the residual pattern of the thin silicon dioxide layer 362 which served as a mask for etching apertures 240 and cavities 368 into the substrate 360 of the carrier wafer 102, as discussed above. A dummy wafer covered with a silicon dioxide layer is placed over wafer 102 and bonded to it by pressing the oxidized layer 362 and that of the dummy wafer together in an oxidizing atmosphere at a temperature exceeding 700° C. The substrate of the dummy wafer is then etched away leaving the new silicon dioxide layer bonded to silicon dioxide layer 362. This new layer is selectively etched, removing it from regions containing apertures 240 and circuit elements while leaving it over cavities 368. The silicon dioxide portions remaining over cavities 368 define flexible membranes 370.

Fabrication of membranes 370 for chips 104 is identical to the process described above. Here cavities 368, which are etched into substrate 364, and apertures 240 are defined by the silicon dioxide layer 366.

An alternative fabrication method for membranes 370 in both the carrier wafer 102 and chips 104 involves two L-shaped apertures formed through respective silicon dioxide layers 362 and 366 and into the silicon underneath. The L-shaped apertures define the sides of a square region where they face each other across its diagonal. Each leg of each aperture exceeds one half of the side of the square, so that the projection of a leg onto the opposite side of the square overlaps the leg located there. These overlapping features are necessary to ensure a complete etch below the square region in the subsequent processing step.

An EDP etch through the L-shaped apertures removes the silicon under the square to a depth defined by P+ layer 372, as shown in FIG. 3A. After completion of the etch, the L-shaped apertures can be filled with polycrystalline silicon. The final structure comprises the square region, which defines one of the membranes 370, and the void underneath it which is the associated cavity 368.

The fabrication of membranes 370 and cavities 368 is described in U.S. Pat. No. 4,949,148.

The mechanical attributes of the connection assembly 400, and more specifically, the ability of the post 376 to shift when subjected to stress, is a key feature of this embodiment. Connection posts 376, comprised of posts 222, 216 and solder bump 228, tilt through an angle $\Theta$ in response to a lateral displacement $\Delta l$ caused by differential thermal expansion, as shown by the two $\Delta l/2$ displacements in FIG. 3B. The posts can move in their axial direction as well as tilt orthogonal to it, i.e. in XY planes parallel to upper surfaces 232 and 234 of chips 104 and carrier wafer 102 respectively. This ability to move, predicated on the flexibility of membranes 370, relieves flip-chip assembly 300 of the shear strain experienced in its conventional rigid counterparts during differential thermal expansion. Alleviation of shear strain practically eliminates solder bump failures, and thereby yields significantly more reliable flip-chip assemblies.

FIG. 3B is a simplified representation of the response of the connection post 376 to differential thermal expansion. The response is shown as a rotation of the post axis about a stationary center, while displacement $\Delta l$ is illustrated as two partial displacements $\Delta l/2$ of chip and carrier in opposite directions. Assuming that the temperature of chip 104 rises with respect to that of carrier wafer 102, $\Delta l$ is defined as the maximum obtainable displacement across the chip for a temperature difference of $\Delta T = 50°$ C.

When quiescent conditions exist, chips 104 and carrier wafer 102 have equal temperatures and membranes 370 are flat with minimal internal tension. During operation, the temperature of the chips 104 rise above that of the carrier wafer 102 effecting differential thermal expansion between them. As a result, first layer metal interconnect 342, which is the bottom of post 216 in chip 104, pulls connection post 376 into a tilting position enabled by the flexibility of membranes 370. The tilting of connection post 376 applies tension to membranes 370 of chip 104 and carrier wafer 102, resulting in their deformation.

Displacement $\Delta l$ caused by differential thermal expansion is proportional to the chip area and the temperature difference $\Delta T$ between chip 104 and carrier wafer 102. Assuming a chip area of approximately 10.0 mm × 10.0 mm and a temperature difference of $\Delta T = 50°$ C., a displacement of $\Delta l = 0.86$ m is obtained. If the height of the connection post 376 is designated "h" then based on the dimensions listed above $h = 2 \times 7.8 + 3.0 = 18.6$ um, yielding a ratio of $\Delta l/h = 4.6\%$. This "tilting ratio", which defines the lateral force acting on the connection post 376, is reasonably small and is in stark contrast to the large force and movement required by prior art devices.

Figure 5:
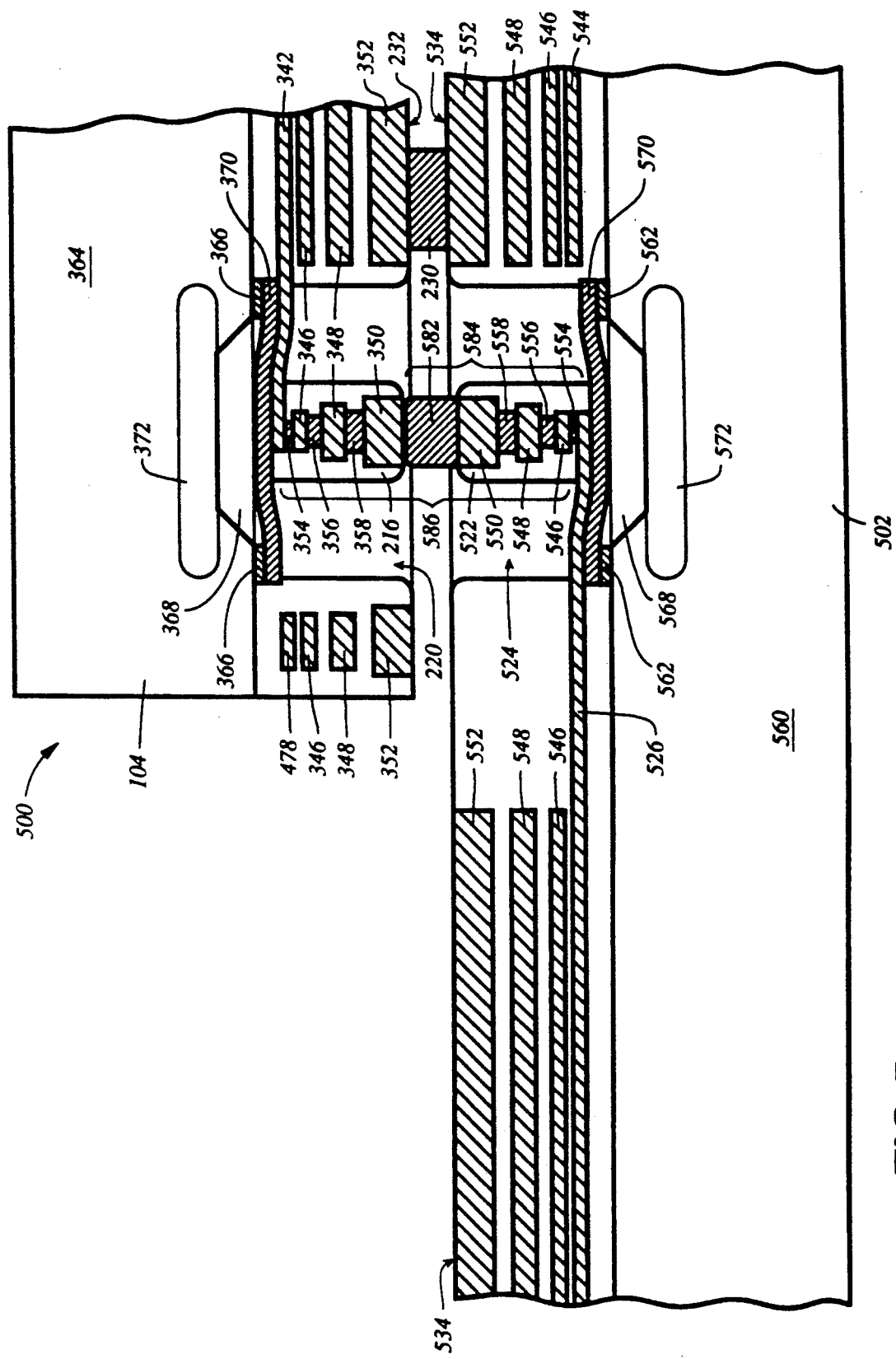
FIG. 5 is a sectional view of a "membrane prober" assembly in accordance with the present invention.

Testing of the flip-chip assembly 300 and its individual components is accomplished by using the membrane prober assembly 500, as shown in FIG. 5. It differs from the flip-chip assembly 300 by employing metal bumps 582 in place of solder bumps 228. Metal bumps 582, attached to posts 522 of test carrier wafer 502, are directly deposited on fourth layer metal islands 550 to become an integral part of the "test posts" 584. Construction and fabrication of posts 522 and the flexible members of the test carrier wafer 502 are identical to their counterparts in the flip-chip assembly 300, as described above. Post 522 contains a conductive structure surrounded by a dielectric shell. The conductive structure comprises metal islands 550, 548, 546 and a first layer metal lead 526 interconnected by vias 558, 556 and 554 respectively. Flexible members of the carrier wafer 502 consist of membranes 570 formed over cavities 568 which are etched into the substrate 560 down to the P+ buried layer 572. Oxide layer 562 of the wafer 502 is left from the fabrication of membranes 570.

The height of the metal bumps 582 exceeds that of the limit feet 230 by about 1.0 um to 2.0 um to accommodate spacing variations of opposing posts 522 and 216 across the attachment area during closure of the test assembly. Test posts 584 of the test carrier wafer 502 and the posts 216 of chips 104 are attached to respective membranes 570 and 370, which will yield to compensate for vertical spacing variations between opposing posts. The force deflecting membranes 570 and 370 is applied by a clamp pressing on chips 104 when the test jig housing assembly 500 is closed. Limit feet 230, define the minimum spacing between the chips 104 and the carrier wafer 502, thereby setting the depressions of membranes 570 and 370 respectively.

During differential thermal expansion between the chip and the carrier of assembly 500, post 216 can move with respect to the test post 584, causing it to slide at the interface (350, 582). Furthermore, test post 586 can tilt due to the flexibility of the membranes 570 and 370.

A typical electrical path through the test assembly 500 contains a first layer metal interconnect 342 of die 104 connected to a first layer metal interconnect 526 of a carrier wafer 502 via test post 586. Terminals of the test carrier wafer 502 are attached to the upper conductive surfaces 534 of the interconnect metal structures made of layers 552, 548, 546 and 526.

Membrane prober 500 can be used for testing a complete assembly configuration 300, or alternatively, individual chips 104. Separate carrier wafers 502, uniquely wired for each test configuration, can also be used. Terminals of the respective test carrier wafers 502 are then wire bonded to conductors of ceramic housings, like 108 shown in FIG. 1, which are part of the test jigs accommodating the test assemblies 500. These conductors are connected to the pins of the final test packages (test jigs), which are either interfaced with a tester or serve as a "system emulator" depending on the test methodology used as described below.

Two test methodologies can be used employing the test assembly 500, shown in FIG. 5. A conventional test method takes advantage of interfacing membrane prober 500, having buffer chips if desired, with a tester to perform vector testing of individual chips or complete assemblies. Alternatively, a particularly important test method utilizes the assembly as a "system emulator" for testing individual production chips. This "in-system" test method has the significant advantage of providing a test environment that accurately represents the full system, and saves the ever increasing costs of test development and associated hardware required for testing of complex systems in the conventional way.

The "in-system" test method avoids the many drawbacks experienced with conventional testing of an assembly on a tester. For example, large power transistors required to drive the low impedance (50 ohm) transmission lines, connecting chip and tester, are no longer required. Also, instead of testing the chip with the test-vectors supplied by a tester, "structured testing" can be performed by means of the natural environment of the product system, as presented to the chip through the carrier wafer. The carrier wafer has, as an option, special built-in circuits to speed up test coverage.

This testing can be performed on unpackaged chips taken directly from the wafer without screening tests, if desired, and without having to commit a costly package to an untested part. Besides reducing the loading from the 50 ohm inputs of the tester, the test points, as well as the connection posts not used for testing, can be made with greatly reduced parasitic capacitance compared to conventional bonding pads. A further reduction in parasitics is realized since the electrostatic discharge (ESD) protection circuits can be eliminated from the chips.

Due to the low overhead in parasitics, the connection posts present the equivalent of an "on-chip" path to the carrier wafer and thereby to another chip in the assembly. It is also feasible to use the interconnect levels provided by the carrier wafer as intra chip interconnects in addition to the "on-chip" interconnects.

A prime advantage of the present invention, in the embodiment as discussed above, is the combination of conventional solder bump technology with a flexible attachment method in flip-chip assemblies. During periods of differential thermal expansion between the chip and the carrier, such MCM assemblies are relieved of shear strain compared to conventional rigid structures where the strain causes the solder joints to fail. The strain relief, provided by the present invention, yields MCM assemblies which are reliable and at the same time retain the advantages of the one shot solder connection process.

A second advantage of the present invention lies in the fabrication process for connection posts 216 and 222, which is an integral part of the process used to make the IC die 104 and the IC carrier wafer 102, respectively. As a result the attachment method of the present invention requires minimal process overhead.

A third advantage is the adaptability of the new attachment method to multi-level interconnect structures and the simultaneous realization of a small characteristic pitch of an equally spaced succession of connection posts 376 without the dielectric partitions. A pitch of 14.0 $\mu$m or better can be obtained depending on the chip-to-carrier alignment tolerance.

A fourth advantage of the present invention is the inherent capability of devising test methods compatible with the new attachment method. This is realized by membrane prober 500 which employs test metal bumps 582 for probing in place of solder bumps 228. This membrane prober assembly can be configured for testing a complete assembly, such as 300, and alternatively, individual chips 104. For conventional vector testing the prober assembly is interfaced with a tester, however it can also be utilized as a "system emulator" for testing individual production chips. This "in-system" test capability is of particular importance since it dispenses with the many technical drawbacks and high costs associated with conventional vector testing.

The present invention provides for numerous variations to the embodiments described above. The crystallographic planes chosen for wafer and chip surfaces as well as the alignment structures can be varied. The procedures for forming the alignment structures can be varied to accommodate the selected crystallographic planes. For example, an alternative etchant to EDP can be used to form walls along chosen planes.

In the embodiment shown in FIG. 2, apertures are formed in the wafer and slots in the chip however alternative arrangements are usable. For example, apertures can be formed in IC chips 104 in place of the slots. Furthermore, protruding structures can be formed in either the chips or the wafer to mate with corresponding recessive features in the mating component. For example, a wafer can be masked and selectively etched to leave protruding elements which allow alignment with slots in the chips. Such an embodiment does not require pin blocks. In the embodiments using pin blocks, it is not necessary that they conform closely with the walls of apertures and slots. As an example, microspheres (of alumina of latex) can serve as pin blocks.

There are different options for the fabrication of the cavities and the membranes. Cavities need not be formed concurrently with the apertures nor use a similar process. For example, cavities can be formed by etching through the substrate from the backside. Instead of air, the cavities can be filled with an alternative compressible material, such as polyimide. The flexible membranes can be shaped as bridges or cantilevers rather than cover the cavities completely, as illustrated in the preferred embodiment. Bridges can be formed by using a pair of cantilevers or by patterning a membrane with the L-shaped aperture technique proposed before.

The present invention also provides for many alternatives to the embodiments of the connection post assemblies 400 shown in FIGS. 3A and 4. These are discussed below.

A conductive post, flexibly attached to the both the chip and the carrier, can provide an alternative attachment method to the method described above. The flexible attachment means can include any mechanical structure, flexible material or both, which at the same time can provide electrical connections between the chip and carrier. A variation to the attachment method described above, uses a post flexibly attached to at least one assembly component, i.e. either a chip or a carrier. Attachment at the other end may or may not be flexible. When one end is flexibly attached, the post itself is preferably flexible. Specifically, the flexible attachment in such an arrangement can be realized by a membrane placed on a cavity as described in the embodiment above. Additionally, this "one-sided flexible" attachment method can use a post formed by two posts joined by solder, as described.

The contact surfaces of the connection posts need not be co-planar with the active regions of the chip and the wafer as in the embodiment above. In fact, protruding posts can be fabricated in either assembly component, such as the test posts 584 of the membrane prober assembly 500, shown in FIG. 5, and used for alternative connection techniques. Furthermore, cross sections of the connection posts, which are preferably laid out as squares, can also be rectangular patterned or have any other advantageous shape achievable with conventional processing.

The stand alone connection posts separated by dielectric walls are shown. They can be located anywhere on the chips or carrier wafer. A variation of this case is a succession of equally spaced connection posts without dielectric partitions, which is normally used for input/output circuit terminals around the periphery of a chip. The minimum spacing (pitch) between the adjacent posts is limited by the chip-to-carrier alignment tolerance and adjusted to easily accommodate the small lateral mismatch between opposing posts. Fabrication of a succession of posts requires etching a multiple-vacant "ring chain" into the silicon component in place of the single vacant rings which form separate posts.

Limit feet need not be attached exclusively to the chips. They can be formed on carriers as well. Furthermore, limit feet can be made of oxide instead of metal used in the embodiment described above. Also, the solder composition can differ from the one used in the preferred connection posts 376.

This invention is not restricted by the number of interconnect layers used in the IC process of the assembly components 104 and 102. Even though four layers of metal are employed in the embodiment, this number can exceed or be less than four.

Additional embodiments of the present invention are shown in FIGS. 6 through 14(B). In these embodiments, a cantilevered conductor is supported by a post which, in turn, is supported on top of a flexible membrane.

Figure 6:
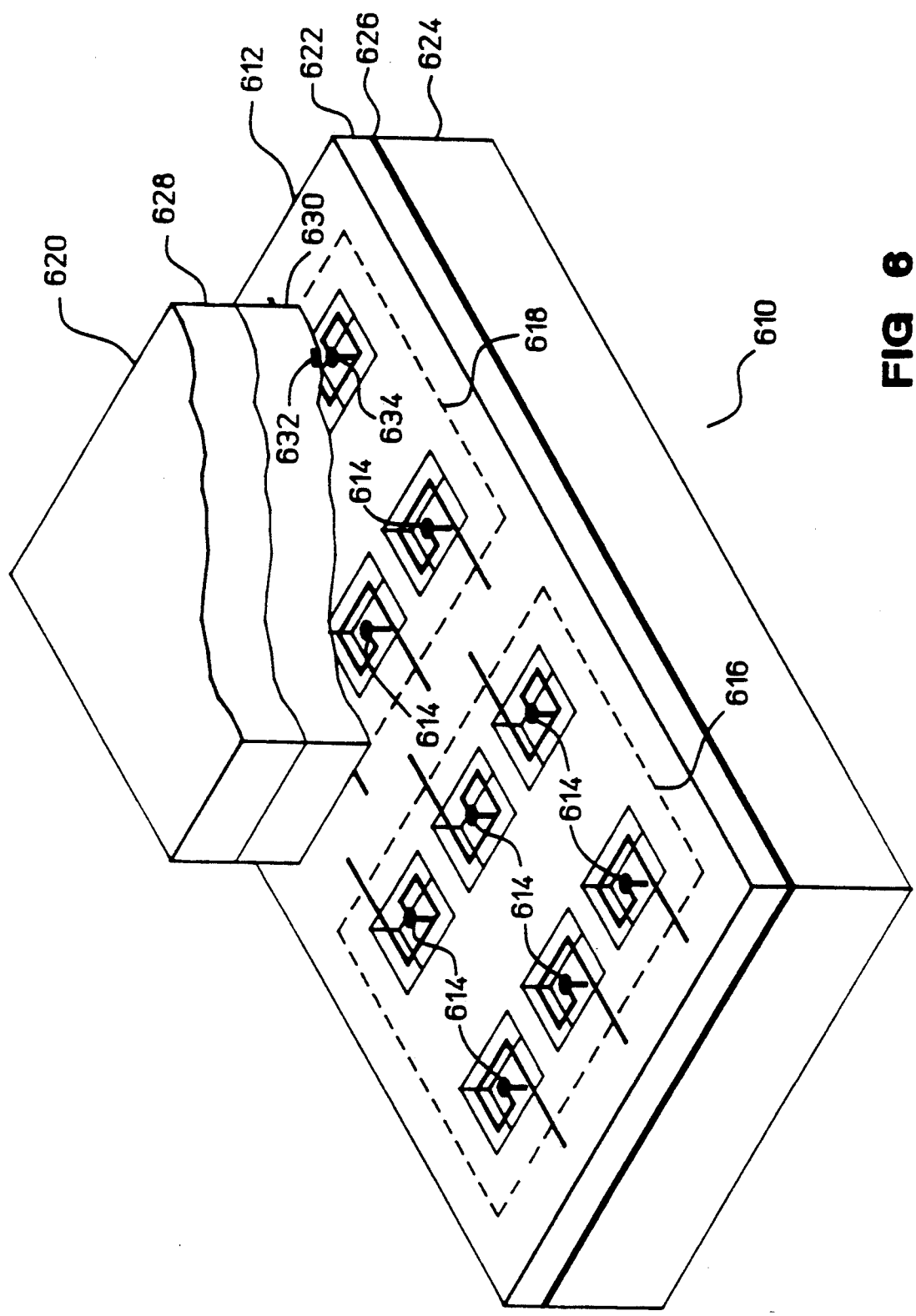
FIG. 6 is an isometric view of an MCM module including an MCM substrate with a series of resilient connection pads of the present invention, and a partially cutaway view of a portion of an MCM sub-chip positioned for connection thereabove.
Figure 7:
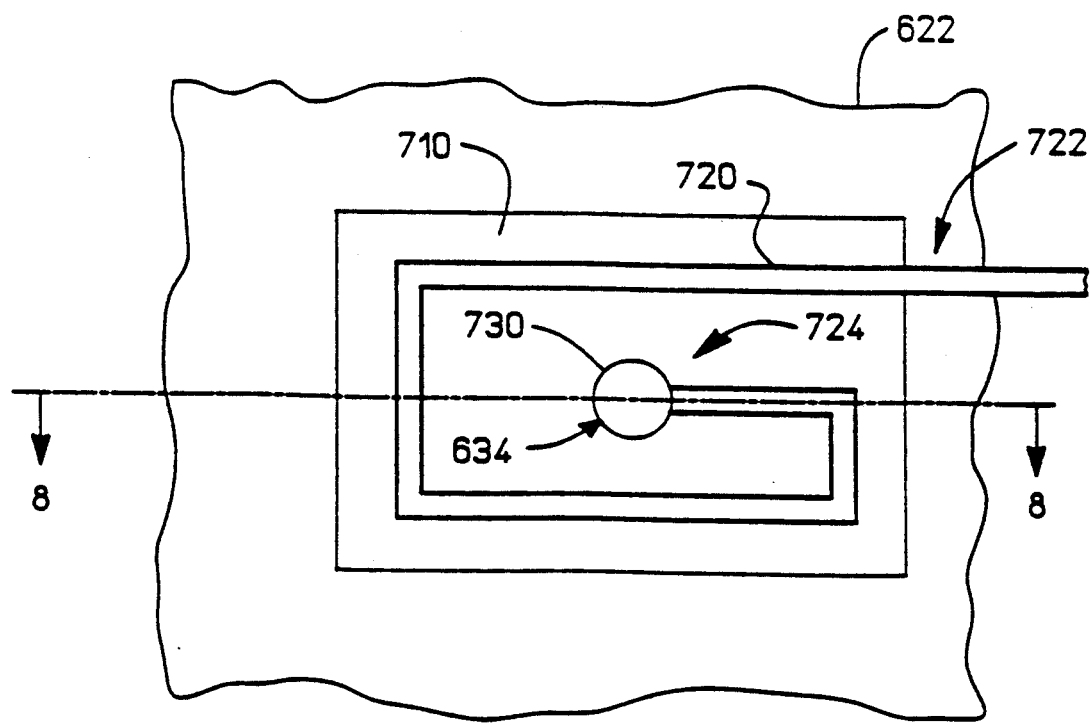
FIG. 7 is an enlarged plan view of one of the resilient connection pads shown in FIG. 6.

As shown in FIG. 6, in an alternate embodiment of the invention, an MCM generally 610 has a substrate 612 that includes a plurality of resilient connection pads 614. The pads 614 are arranged on an upper surface of the substrate 612 in a plurality of groupings or "footprints" 616 and 618 such that all the pads in one footprint are laid out in a pattern that corresponds with a pattern of connectors on one chip. The MCM also includes a chip 620, shown partially cutaway, having a plurality of connectors such as a connector 632 arranged on a surface of the chip 620 for connecting with the pads in the footprint 618. A solder ball, such as a solder ball 730 as in FIG. 7, is used for making electrical connection between the connector 632 and the pad 618. (For convenience, the particular connection pad with which the connector 632 connects is indicated by a reference numeral 634, but it will be understood that this pad 634 is exemplary of the other pads 614.)

Figure 8:
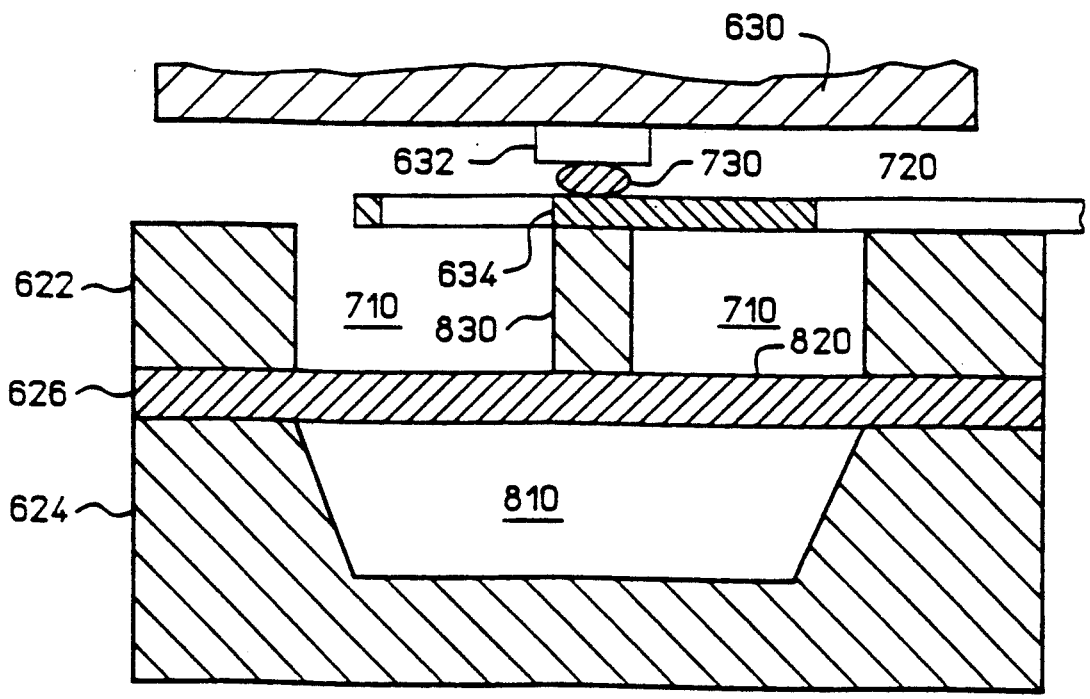
FIG. 8 is a cross sectional view of the resilient connection pad shown in FIG. 7 taken along view line 8-8.
Figure 9:
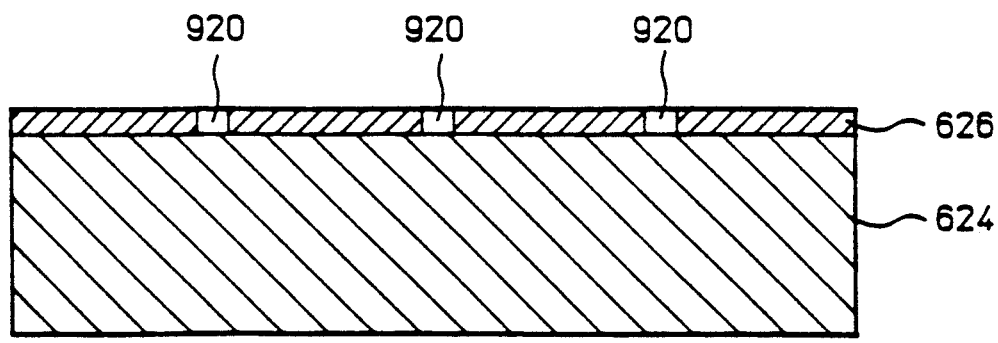
FIG. 9 is a cross sectional view of a portion of an MCM substrate at the beginning stage of the fabrication of a resilient connection pad of the kind shown in FIG. 6.

As shown in FIGS. 7 and 8, the connection pad 634 is located over a cavity 710 in the substrate 612. A flexible membrane 820 separates the upper cavity 710 from a lower chamber 810. A post 830 is tiltably supported by the portion of a silicon dioxide layer 626 which forms the membrane 820, and the post 830 projects upwardly through the upper chamber 710. An electrical conductor 720 extends from a connection point (not shown) across the surface of the substrate 612 to the cavity 710 and is cantilevered over the cavity 710 to the post 830. The post 830 supports the pad 634 on an extremity of the conductor 720. The portion of the conductor 720 that extends over the cavity 710 is helically shaped to facilitate flexure. Located between the pad 634 and the connector 632 is a solder ball 730.

A method of fabricating the cavity 810 and the membrane 820 is shown in FIGS. 9–12. The membrane layer 626 is formed of silicon dioxide (SiO2) by conventional techniques on the top surface of a bottom layer 624 of the substrate 612. A silicon, or other IC substrate material, carrier wafer in accordance with conventional IC fabrication processes is used as the substrate layer 624. The membrane layer 626 is penetrated by a series of closely spaced holes 920 above the area where the cavity 810 will be formed.

Figure 10:
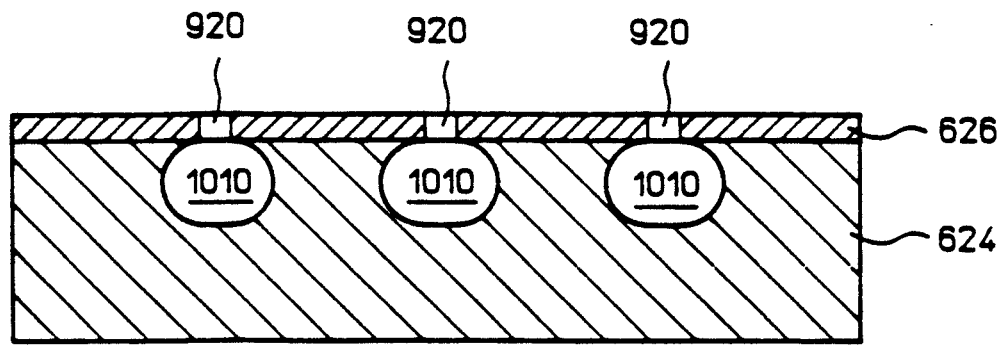
FIG. 10 is a cross sectional view of an MCM substrate, of the kind shown in FIG. 6, at an intermediate stage showing the removal of multiple separate pockets of underlying substrate material.
Figure 11:
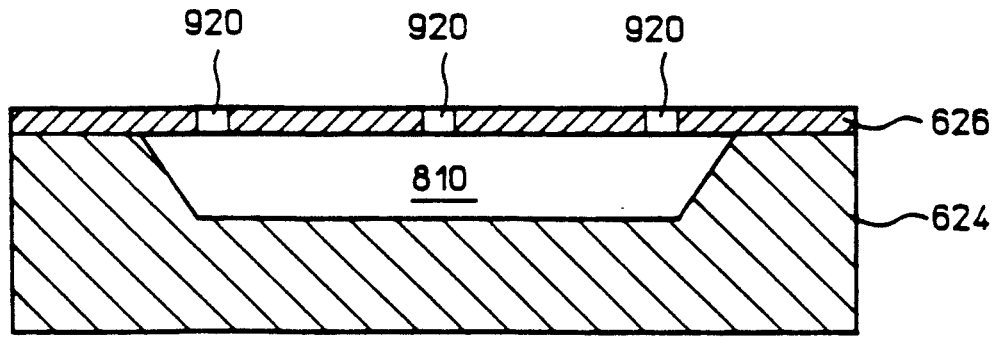
FIG. 11 is a cross sectional view of a MCM substrate, of the kind shown in FIG. 6, at a subsequent stage showing the major membrane cavity formed from the overlapping of multiple pockets.

An appropriate etchant, such as an isotropic silicon, or Si, etch, selective between the bottom substrate layer 624 and the membrane 626, is then applied to produce a series of openings or pockets 1010 shown in FIG. 10. The bottom substrate material layer 624 is then further removed by downward and lateral etching under the closely spaced holes 920 until the pockets 1010 meet and form a single, enlarged central pocket, shown in FIG. 11 as cavity 810.

Figure 12:
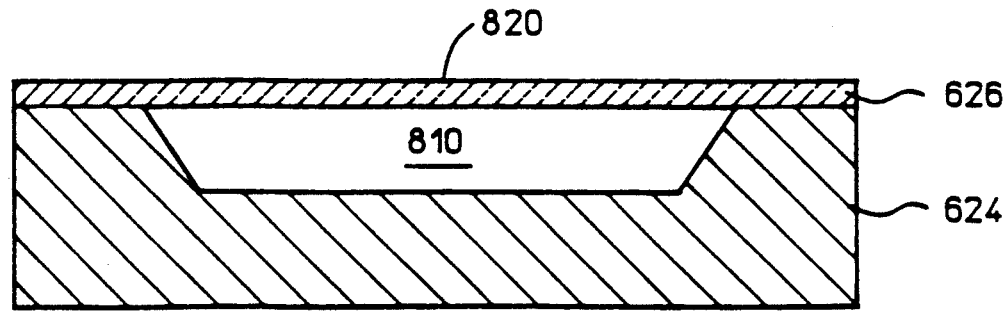
FIG. 12 is a cross sectional view of a portion of an MCM substrate, of the kind shown in FIG. 6, showing a completed membrane and cavity portion of a resilient connection pad.

Thereafter, the membrane layer 626 may be converted to create the membranes 820 by a sealing process by, for example, placing the entire structure in an isotropic dielectric chemical vapor deposition, or CVD, process so that the closely spaced holes 920 will be closed up as shown in FIG. 12. The portion of the membrane layer 626 which is unsupported by the bottom substrate layer 624 becomes the flexible membrane 820.

As is best shown in FIG. 8, after the formation of membrane 820 over the cavity 810, a top substrate layer 622 is formed on the membrane layer 626 by conventional processing techniques which include multilevel metal interconnection. If the layer 622, or a post 830 to be described below, is formed of a conducting or semiconducting material, the top surface thereof may be covered with an insulating layer, for example, silicon dioxide. Cavity 710 is etched in the layer 622 and refilled with a selectively etchable material. A conductor 720 is then formed, using standard IC processing techniques, on the top substrate layer 622 and the refilled cavity 710. The conductor 720 is formed in a helical or other pattern to accentuate its compliance.

The post 830 and the upper cavity 710 are formed by selectively etching the fill material from the cavity 710. This selective etching leaves a column of the top layer material, located under the pad 634, forming the post 830.

In the embodiment as just described, the membrane 820 forms a solid sheet of material that flexes by stretching. In an alternate embodiment, shown in FIGS. 13A through 14B, a perforated membrane 1300 flexes by bending rather than by stretching and thereby provides greater flexibility than the membrane 820. This increased flexibility is desirable in some applications.

In FIG. 13, the closely space holes 1301 penetrate the membrane layer 626 so as to define concentric membrane rings in the layer 626. The concentric rings are patterned such that each concentric membrane ring is held to the ring adjacent to it, in a staggered manner by approximately the same amount of material. As the membrane legs 1302 are positioned closer to the center, they become wider to make up for the fewer legs supporting the subsequent membrane rings.

Figure 13A:
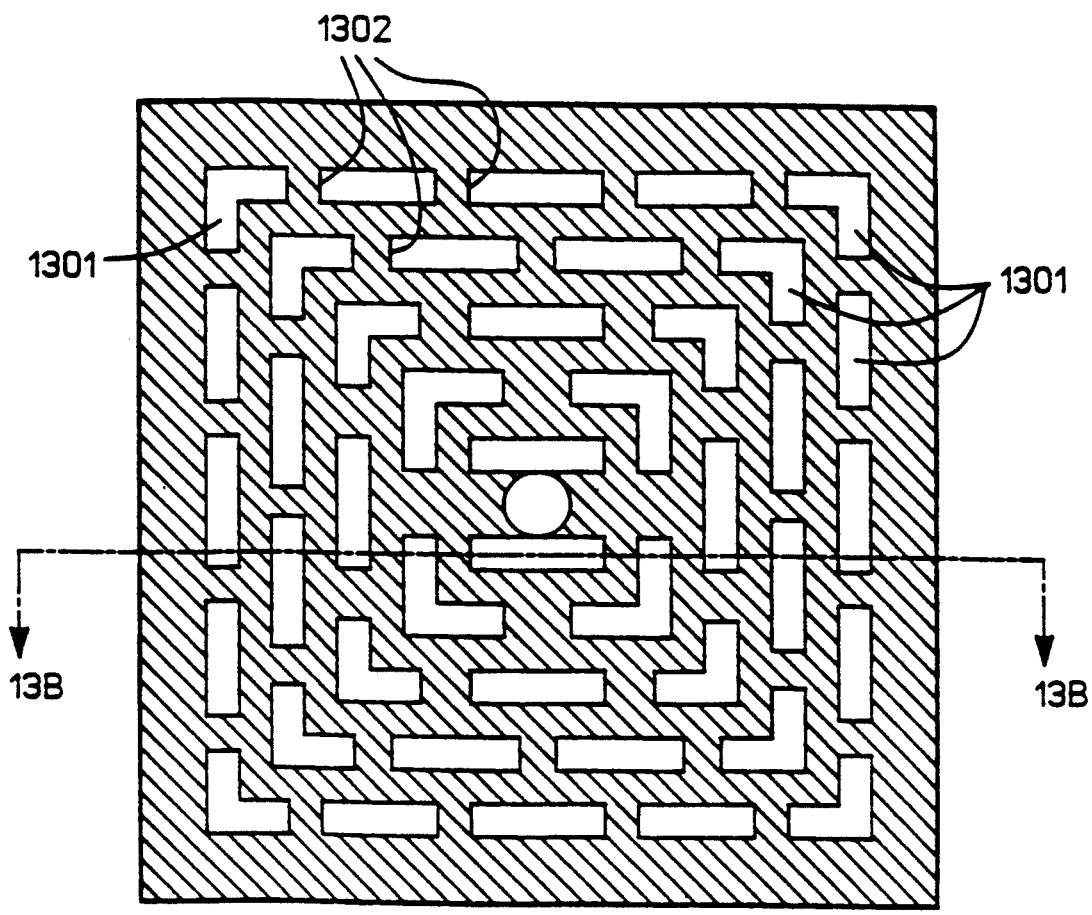
FIG. 13(A) is a plan view of the preferred membrane structure.
Figure 13B:
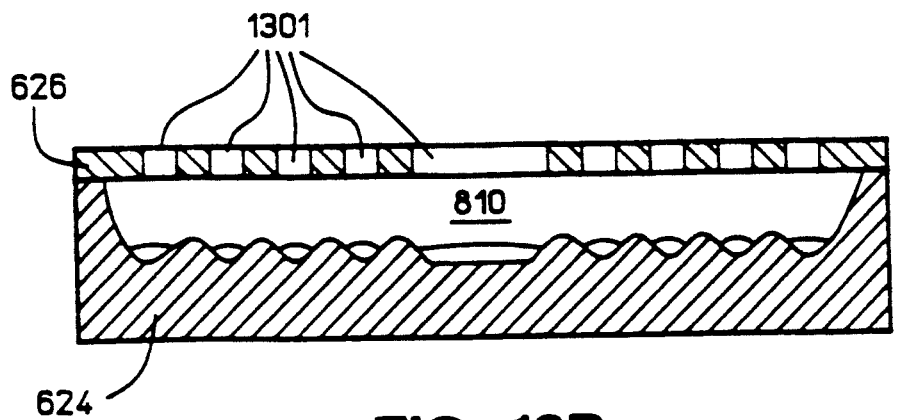
FIG. 13(B) is a sectional view of the preferred membrane structure at the beginning of the process.
Figure 13C:
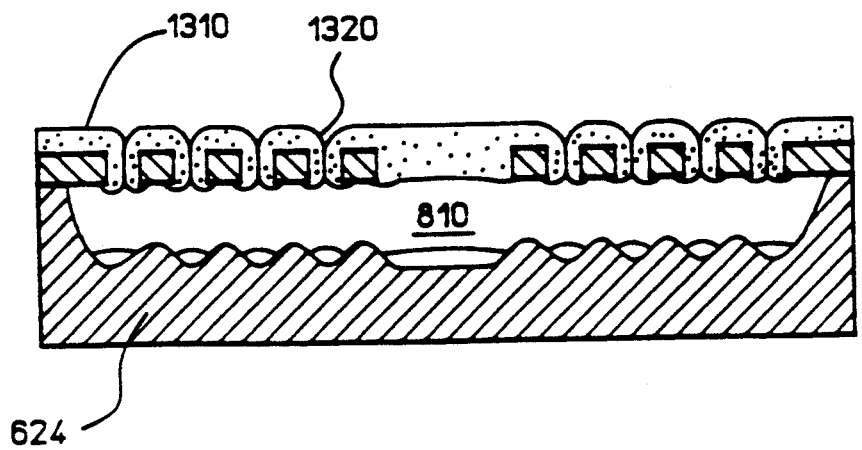
FIG. 13(C) is a sectional view of the preferred membrane structure at an intermediate step in the process.

As shown in FIG. 13B, in constructing the preferred membrane 1300, the silicon dioxide layer 626 is formed on the top surface of the bottom substrate 624 as in the previous embodiment. A plurality of closely spaced holes 1301 are formed to define the concentric rings and a selective etch is used to form the cavity 810 as previously disclosed.

Figure 13D:
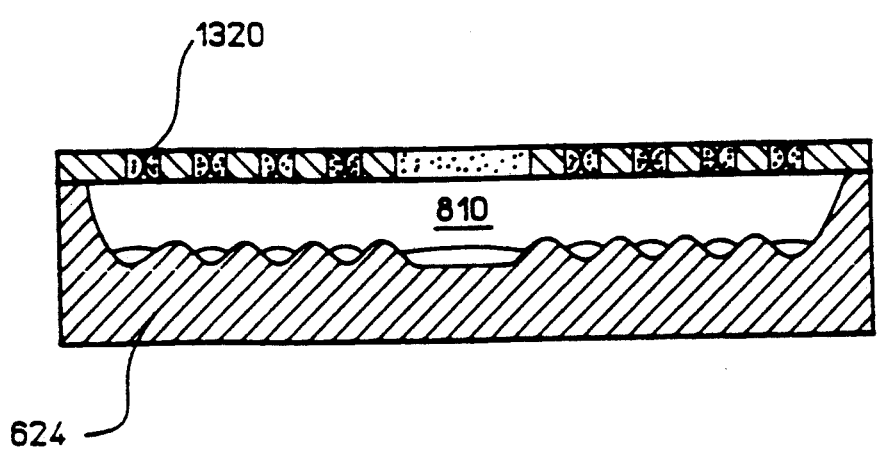
FIG. 13(D) is a sectional view of the preferred membrane structure at a subsequent step.
Figure 14B:
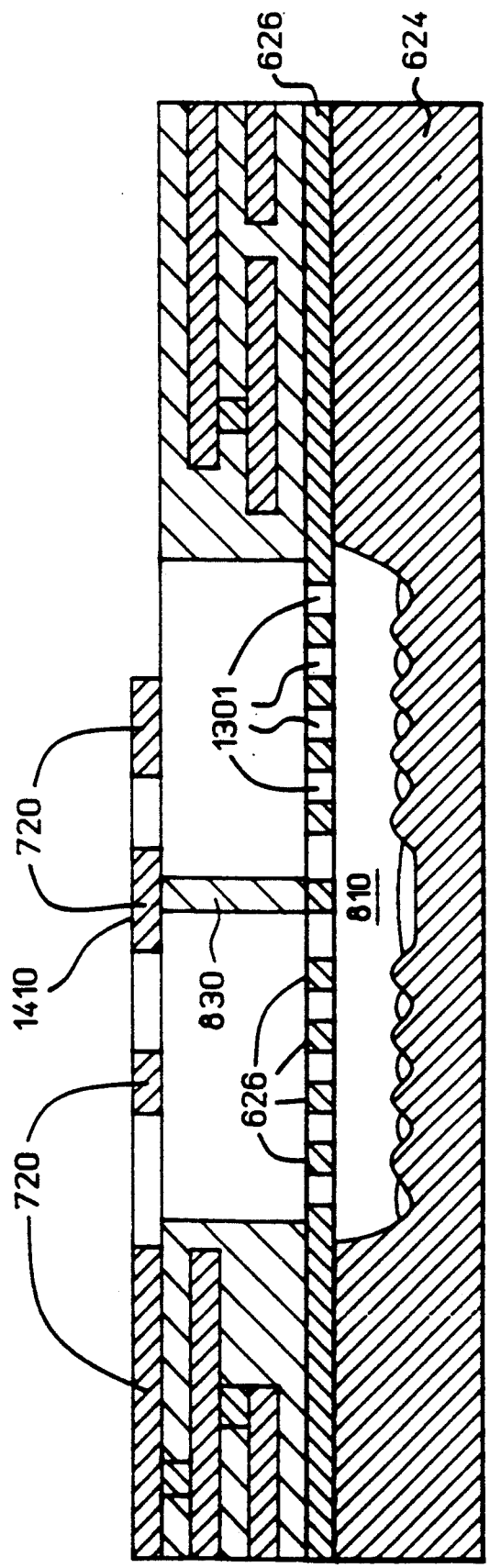
FIG. 14(B) is a sectional view of the preferred membrane and contact structure.
Figure 15:
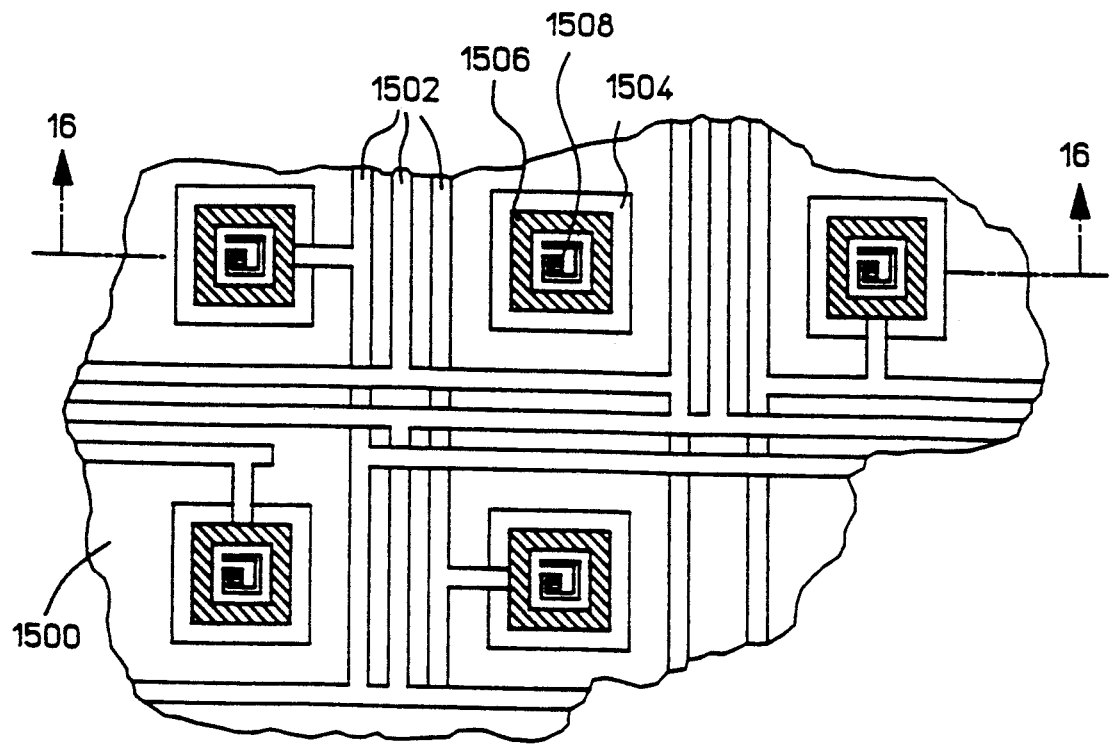
FIG. 15 is a plan view of a prior art interconnection device.
Figure 16:
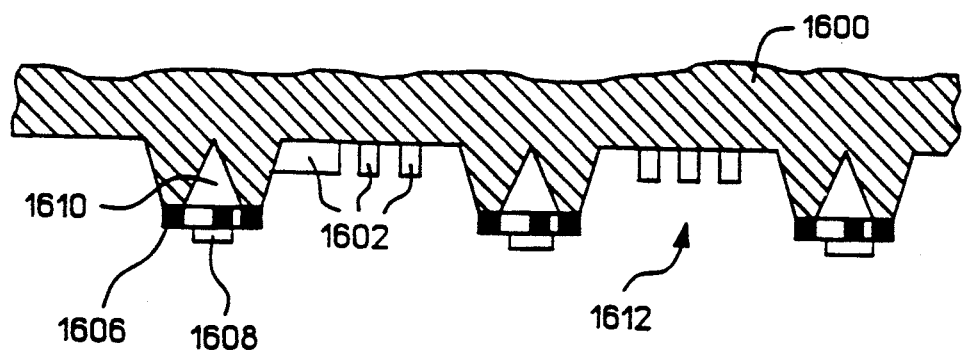
FIG. 16 is section view of a prior art interconnection device.
Figure 17:
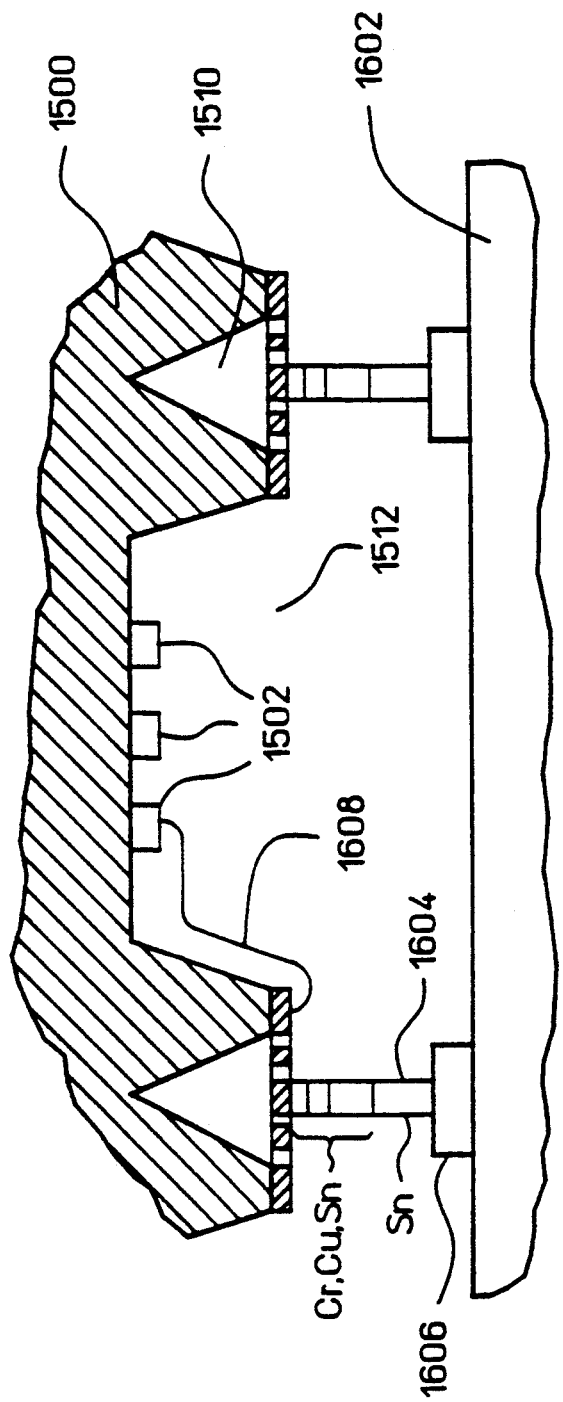
FIG. 17 is an enlarged section view of a prior art interconnection device.

The holes 1301 are filled by a temporary filler (FIG. 13C) to aid subsequent processing. This filler adds thickness 1310 and fills the holes 1320. The excess thickness is etched off leaving only the material in the holes 1320 (FIG. 13D).

In FIG. 14, the connection post 830 and conductor 720 have been formed as previously taught. Also the temporary filler has been etched away from the holes 1301 forming the flexible membrane 1300 with integral rings.

This membrane 1300 design with integral rings permits the membrane to flex with a bending motion instead of a stretching motion. As the most common membrane materials have greater stretching stiffness than bending stiffness, the ring design permits greater membrane flexibility than before.

While this invention has been described with reference to its presently preferred embodiments, its scope is not limited thereto. Rather, such scope is only limited insofar as defined by the following set of claims and all equivalents thereof.

I claim:
1. An integrated circuit assembly comprising:
an integrated circuit carrier;
at least one integrated circuit chip in a flip-chip arrangement with the carrier;
a connection post comprising a first post attached to the carrier, a second post attached to the chip, and a solder bump attaching the first and second posts, the connection post electrically and mechanically connecting the carrier and the chip, the connection post having an axis defining an axial direction, the connection post spacing the chip and the carrier in the axial direction; and
flexible attachment means for attaching the connection post to at least one element of the set consisting of the carrier and the chip so that the connection post can move in the axial direction and tilt with respect to the axial direction;
whereby, when the carrier and the chip undergo differential thermal expansion, the connection post moves to reduce shear strain in planes orthogonal to the normal axial direction along the connection post.

2. The assembly of claim 1 wherein the flexible attachment means provides for flexibly attaching the connection post to both of the carrier and the chip.

3. The assembly of claim 1 wherein the flexible attachment means includes a cavity formed in the element and a flexible membrane formed over the cavity and attaching to the connection post.

4. An assembly as in claim 3 wherein the flexible membrane comprises concentric membrane rings.

5. An integrated circuit assembly comprising:
an integrated circuit carrier having an electrical connection point and a mechanical connection means associated with the electrical connection point;
an integrated circuit chip in a flip-chip arrangement with the carrier, the chip having an electrical connection point and a mechanical connection means associated with the electrical connection point; and
an electrically conductive connection post mechanically connected to both mechanical connection means and in electrical contact with both electrical connection points and defining an electrically conductive path therebetween;

wherein at least one of the mechanical connection means comprises a flexible mechanical connection with the connection post such that the chip is free to move with three axes of freedom relative to the carrier without disrupting the electrically conductive path.

6. An assembly according to claim 5 wherein the connection post comprises a first post having a first extremity connected to the mechanical connection means of the carrier and a second extremity projecting away from the carrier, a second post having a first extremity connected to the mechanical connection means of the chip and a second extremity projecting away from the chip, and means establishing electrical and mechanical connections between the second extremities of the posts.

7. An assembly according to claim 5 wherein the flexible mechanical connection comprises a flexible membrane.

8. An assembly according to claim 7 wherein the membrane is formed over a cavity.

9. An assembly according to claim 5 wherein both of the mechanical connection means comprise flexible membranes.

10. An assembly according to claim 5 wherein the connection post is flexible.

11. An assembly as in claim 7 wherein the flexible membrane comprises concentric membrane rings.

12. An integrated circuit assembly comprising:
a multi-chip substrate;
an electrical conductor cantilevered from the substrate;
at least one sub-chip having a connection pad;
an interconnection means positioned between the cantilevered electrical conductor and the connection pad; and
a flexible membrane for maintaining the cantilevered electrical conductor in electrical contact with the connection pad through the interconnection means.

13. An assembly as in claim 12 wherein the flexible membrane is suspended over a cavity.

14. An assembly as in claim 12 wherein a connection post is mounted on the flexible membrane and supports the cantilevered electrical conductor.

15. An assembly as in claim 14 wherein the connection post is flexible.

16. An assembly as in claim 12 wherein the flexible membrane comprises concentric membrane rings.

17. An assembly as in claims 11 or 16 wherein each membrane ring is attached to the adjacent ring by flexible legs.

18. An assembly as in claim 17 wherein the flexible legs are arranged in a staggered pattern.

* * * * *